(12) United States Patent
Peng et al.

(10) Patent No.: US 7,697,293 B1
(45) Date of Patent: Apr. 13, 2010

(54) HEAT DISSIPATION DEVICE

(75) Inventors: Xue-Wen Peng, Shenzhen (CN);
Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 6 days.

(21) Appl. No.: 12/238,441

(22) Filed: Sep. 26, 2008

(51) Int. Cl.
*H05K 7/20* (2006.01)

(52) U.S. Cl. .................. 361/700; 361/688; 361/689; 361/690; 257/715; 174/15.2; 174/16.1; 174/16.3; 165/80.3; 165/80.4; 165/104.26; 165/185

(58) Field of Classification Search ......... 361/687–700; 174/15.2; 257/715; 165/80.4, 185
See application file for complete search history.

(56) References Cited

U.S. PATENT DOCUMENTS

| | | | |
|---|---|---|---|
| 6,189,601 B1 * | 2/2001 | Goodman et al. | 165/80.3 |
| 6,779,595 B1 * | 8/2004 | Chiang | 165/104.33 |
| 6,909,608 B2 * | 6/2005 | Fan | 361/700 |
| 6,918,429 B2 * | 7/2005 | Lin et al. | 165/80.3 |
| 7,254,023 B2 * | 8/2007 | Lu et al. | 361/698 |
| 7,269,012 B2 * | 9/2007 | Lee et al. | 361/700 |
| 7,269,014 B1 * | 9/2007 | Zhao et al. | 361/700 |
| 7,295,437 B2 * | 11/2007 | Lee et al. | 361/700 |
| 7,532,473 B2 * | 5/2009 | Kuo | 361/697 |
| 2005/0092465 A1 * | 5/2005 | Lin et al. | 165/104.21 |
| 2005/0257532 A1 * | 11/2005 | Ikeda et al. | 62/3.7 |

* cited by examiner

*Primary Examiner*—Boris L Chervinsky
(74) *Attorney, Agent, or Firm*—Frank R. Niranjan

(57) ABSTRACT

A heat dissipation device includes a first heat sink, a second heat sink juxtaposed with the first heat sink and a plurality of heat pipes thermally connecting the first heat sink and the second heat sink. The first heat sink includes a plate-like spreader used for contacting with a first electric component and a honeycomb-like first fin unit thermally attached on the spreader. The spreader is a flat heat pipe. The heat pipes each include a flat plate-shaped evaporating section sandwiched between the spreader and the first fin unit of the first heat sink and a condensing section extending in the second heat sink. Due to a provision of the honeycomb-like first fin unit, the heat dissipation area of the first heat sink greatly increases.

9 Claims, 3 Drawing Sheets

HEAT DISSIPATION DEVICE

BACKGROUND OF THE INVENTION

1. Field of the Invention

The present invention relates generally to heat dissipation devices, and more particularly to a heat dissipation device having excellent heat dissipating efficiency.

2. Description of Related Art

Computer electronic components, such as central processing units (CPUs), generate great amounts of heat during normal operation thereof. If the heat is not properly dissipated, it can deteriorate an operational stability of the electronic components and damage associated electronic devices. Thus the heat must be removed quickly to ensure normal operation of these electronic components. A heat dissipation device is often attached to a top surface of a CPU to remove heat therefrom.

Conventionally, a heat dissipation device attached to a CPU includes a solid base, a plurality of fins arranged on the base, and a plurality of heat pipes extending in the base and the fins. A plurality of grooves is defined in the base, and a plurality of holes is defined in the fins. Each heat pipe has a bent configuration and includes an evaporating section received in a corresponding groove of the base and a condensing section extending from the evaporating section. The condensing section is inserted in a corresponding hole of the fins. However, the heat originating from the CPU is directly absorbed by a middle part of the base and cannot quickly spread to other parts of the base. This results in an overheating of the middle part of the base, while the other parts of the base have a lower temperature relative to the middle part. The fins on the other parts of the base away from the middle part are not efficiently used. The heat dissipating efficiency of the heat sink needs to be improved through sufficient use of all of the fins on the base. Additionally, the fins of a conventional heat sink which have the fins extending upwardly and perpendicularly from the base thereof, do not have a sufficiently large heat-dissipation area to remove heat from the CPU; thus, the heat dissipating efficiency of the heat dissipation device is poor.

What is needed, therefore, is a heat dissipation device with an enhanced heat dissipation performance.

SUMMARY OF THE INVENTION

According to a preferred embodiment of the present invention, a heat dissipation device includes a first heat sink, a second heat sink juxtaposed with the first heat sink, and a pair of heat pipes thermally connecting the first and second heat sinks. The first and second heat sinks are for attaching to first and second CPUs, respectively. The first heat sink includes a plate-shaped spreader thermally attached to the first CPU and a honeycomb-like first fin unit thermally attached on the spreader. The heat pipes each include an evaporating section received in the first fin unit and tightly sandwiched between the spreader and the first fin unit and a condensing section extending in the second heat sink. The spreader is a flat heat pipe. Due to a provision of the honeycomb-like first fin unit, the heat-dissipation area of the first heat sink is greatly increased and the heat dissipating efficiency of the heat dissipation device is accordingly enhanced.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
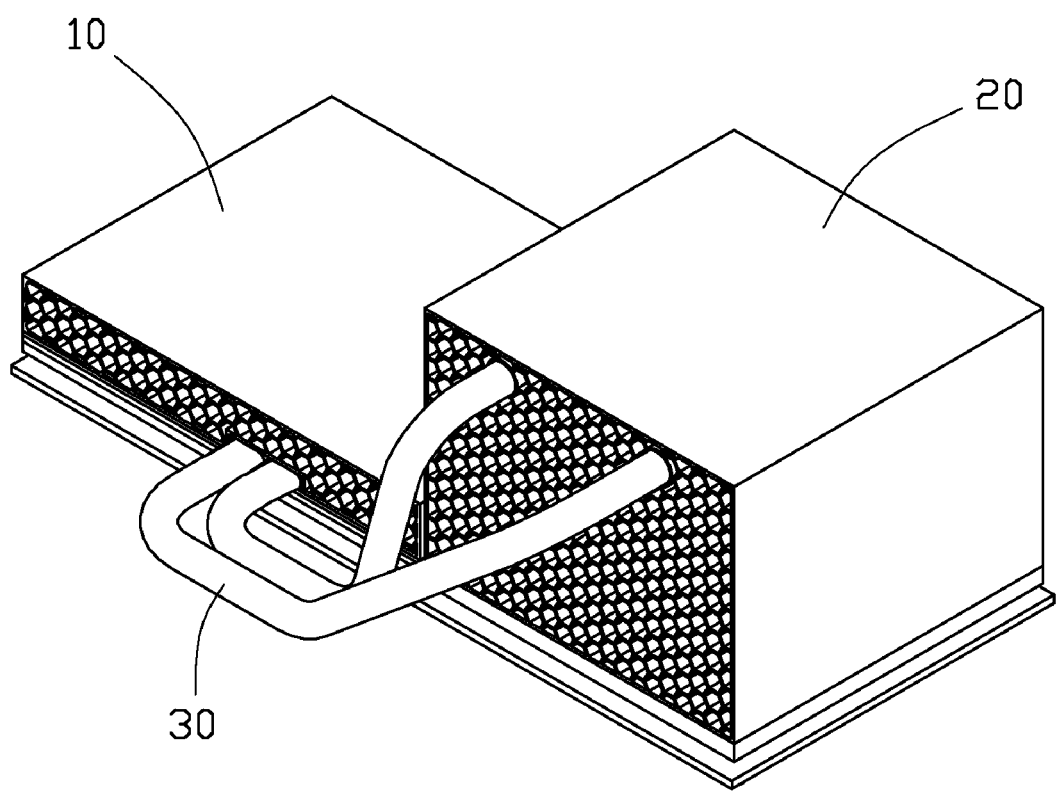
FIG. 1 is an assembled, isometric view of a heat dissipation device in accordance with a preferred embodiment of the present invention.
Figure 2:
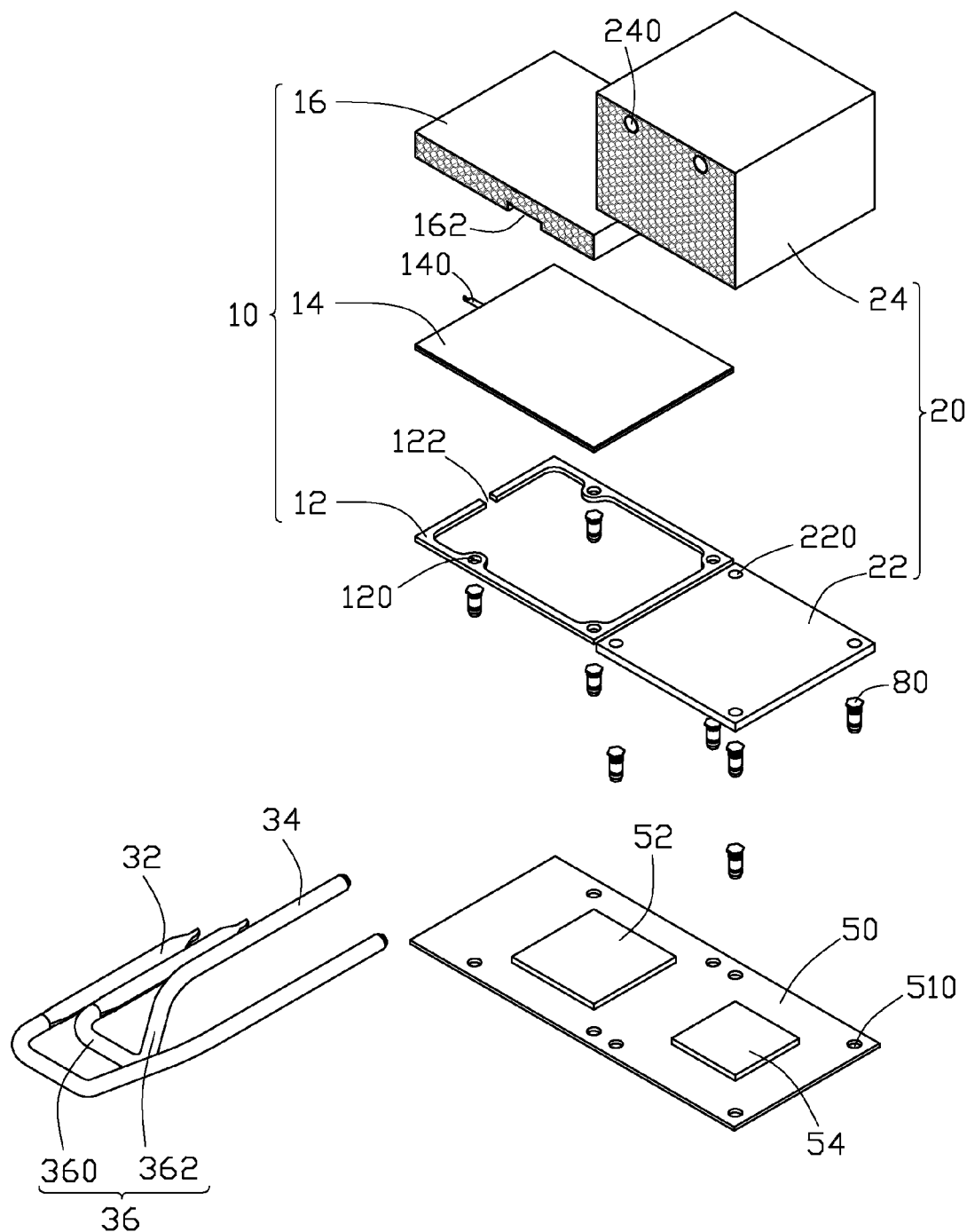
FIG. 2 is an exploded, isometric view of the heat dissipation device in FIG. 1.
Figure 3:
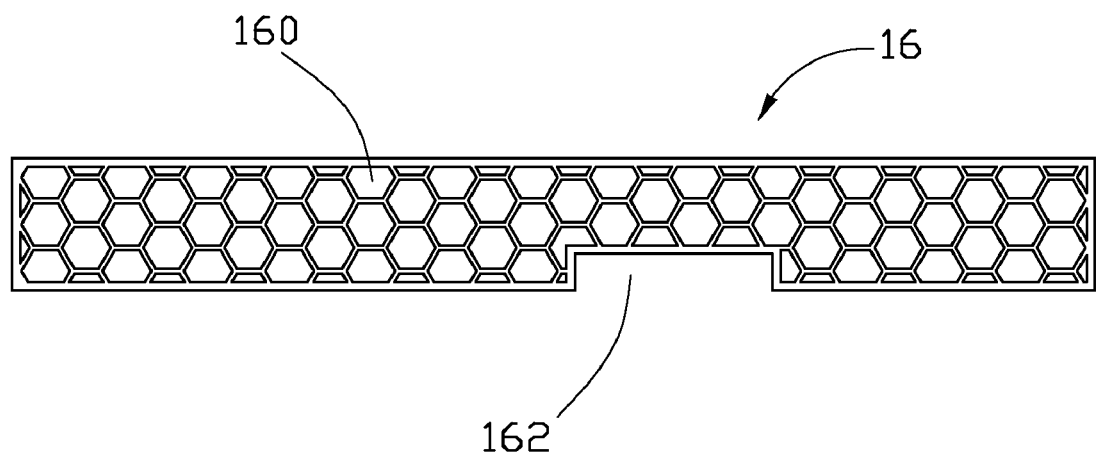
FIG. 3 is a front view of a first fin unit of the heat dissipation device in FIG. 1.

Referring to FIGS. 1-3, a heat dissipation device in accordance with a preferred embodiment of the present invention comprises a first heat sink 10, a second heat sink 20 juxtaposed with the first heat sink 10 and a pair of heat pipes 30 thermally connecting the first and second heat sinks 10, 20 together. The first and second heat sinks 10, 20 are adapted for removing heat from first and second heat-generating electronic components such as a first and second CPUs 52, 54 mounted on a print circuit board 50 and spaced from each other.

The first heat sink 10 comprises a rectangular frame 12, a plate-shaped spreader 14 thermally attached on the frame 12 by soldering and a first fin unit 16 soldered on a top surface of the spreader 14. The frame 12 defines four through holes 120 in alignment with four fixing holes 510 defined in the print circuit board 50 surrounding the first CPU 52, for extension of fasteners 80 therethrough to secure the frame 12 to the print circuit board 50. A cutout 122 is defined through a middle portion of a short side of the frame 12. The spreader 14 is substantially a rectangular flattened heat pipe, having a lighter weight and better heat transferring capability than a solid metallic plate such as a copper plate with an equal volume. The spreader 14 defines a cavity (not shown) therein and contains working fluid in the cavity. The working fluid has phase change when it works. A sealed tube 140 extends outwardly and horizontally from a short lateral side of the spreader 14 through the cutout 122 of the frame 12, when the spreader 14 is mounted on the frame 12. The first fin unit 16 is a honeycomb-like structure and formed by stacking formed metal sheets with high heat conductivity such as formed aluminum or copper sheets, wherein each formed metal sheet has a hexagonal cross section. An air passage 160 is defined in each formed metal sheet, extending from a front side to a rear side of the first fin unit 16. Understandably, the shape of the cross sections of the air passages 160 can be other shapes in an alternative embodiment. A receiving groove 162 with a rectangular cross-section is defined in a bottom of the first fin unit 16 and parallel to the short lateral sides of the first fin unit 16. The receiving groove 160 is constructed for receiving the heat pipes 30 therein.

The second heat sink 20 comprises a rectangular base 22 and a second fin unit 24 thermally attached on a top surface of the base 22 by soldering. Understandably, the base 22 can be a vapor chamber with work fluid filled therein in an alternative embodiment. In the present embodiment, the base 22 is a thin plate made of copper or copper alloy. The base 22 defines four mounting holes 220 in four corners thereof, for extension of the fasteners 80 therethrough to mount the base 22 on the second CPU 54 mounted on the print circuit board 50. The second fin unit 24 is also a honeycomb-like structure and formed by stacking formed aluminum or copper sheets each with a hexagonal cross section. The second fin unit 24 also defines a plurality of air passages (not labeled) in the second fin unit 24 and parallel to the air passages 160 of the first fin unit 16 of the first heat sink 10. The second fin unit 24 has a height much larger than that of the first fin unit 16 of the first heat sink 10. A pair of receiving holes 240 with circular cross sections are defined in a top portion of the second fin unit 24 and spaced from each other, for accommodating the heat pipes 30 therein.

Each of the heat pipes 30 has a flat-shaped evaporating section 32, a round condensing section 34 and a connecting section 36 formed between the evaporating section 32 and the condensing section 34. The evaporating section 32 has a flat top surface (not labeled) and a flat bottom surface (not labeled) opposite to the flat top surface, for providing a larger contacting area, when the evaporating sections 32 of the heat pipes 30 are received in the receiving groove 162 and thermally attached to the bottom surface of the first fin unit 16 and the top surface of the spreader 14. The flat bottom surfaces of the evaporating sections 32 of the heat pipes 30 are attached and soldered on the top surface of a middle of the spreader 14 of the first heat sink 10. The condensing sections 34 are engagingly received in the receiving holes 240 of the second fin unit 24 of the second heat sink 20. The connecting sections 36 each comprises a first portion 360 located adjacent to the evaporating sections 32 and a second portion 362 located adjacent to the condensing sections 34. The first portions 360 of the connecting sections 36 are juxtaposed to each other and parallel to a front side of the first and second heat sinks 10, 20. The first portions 360 are vertical to the evaporating sections 32 and located in a different plane from the second portions 362.

In operation, the heat dissipating device is mounted on the print circuit board 50 by the fasteners 80 received in the through holes 120, the mounting holes 220 and the fixing holes 510. The spreader 14 of the first heat sink 10 is kept in intimate contact with the first CPU 52 and absorbs heat generated by the first CPU 52. Due to the excellent heat conductivity of the spreader 14, the heat from the first CPU 52 is quickly transferred to all parts of the spreader 14, and then evenly and effectively distributed to the whole first fin unit 16 and finally brought into ambient air. As the heat pipes 30 are thermally connected with the first and second heat sinks 10, 20, part of the heat from first CPU 52 is transferred to the top portion of the second fin unit 24 of the second heat sink 20 by the heat pipes 30. The base 22 of the second heat sink 20 is thermally attached to the second CPU 54 and absorbs heat generated by the first CPU 52. The heat from the second CPU 54 is transferred upwardly from the bottom portion to the top portion of the second fin unit 24 of the second heat sink 20. Thus, the heat from the part of the first CPU 52 and the second CPU 54 can be evenly distributed in the second fin unit 24 to sufficiently use every part of the second fin unit 24.

As each of the first and second fin units 16, 24 has a honeycomb-like structure, a heat-dissipation area of each of the first and second heat sinks 10, 20 is larger than that of a conventional heat sink in a equal volume. Moreover, due to an existence of the spreader 14, the heat from the first CPU 52 is transferred to the spreader 14 and evenly distributed in the first fin unit 16 via the spreader 14, thereby enabling the first fin unit 16 to be effectively utilized.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
 a first heat sink comprising a plate-shaped spreader which is a flat heat pipe with a work fluid filled therein, adapted for contacting with a first heat-generating electronic component, and a honeycomb-shaped first fin unit thermally attached to the spreader;
 a second heat sink juxtaposed with the first heat sink; and
 a plurality of heat pipes thermally connecting the first heat sink and the second heat sink, the heat pipes each comprising a flat plate-shaped evaporating section sandwiched between the spreader and the first fin unit of the first heat sink, a condensing section extending in the second heat sink and a connecting section formed between corresponding evaporating and condensing sections, the connecting section comprising a first portion close to the evaporating section and a second portion close to the condensing section, the first portion being located at a plane different from that of the second portion.

2. The heat dissipation device as claimed in claim 1, wherein the first portion of the connecting section is perpendicular to the evaporating section of the each heat pipe.

3. The heat dissipation device as claimed in claim 2, wherein the first portion of the connecting section of the each heat pipe is parallel to a lateral side of the first and second heat sinks.

4. The heat dissipation device as claimed in claim 2, wherein the first fin unit of the first heat sink defines a receiving groove in a bottom thereof and the evaporating sections of the heat pipes are received in the receiving groove.

5. The heat dissipation device as claimed in claim 4, wherein top surfaces of the evaporating sections of the heat pipes are coplanar with a bottom surface of the first fin unit of the first heat sink.

6. The heat dissipation device as claimed in claim 5, wherein the second heat sink comprises a honeycomb-shaped second fin unit and the condensing sections of the heat pipes are extended in a top portion of the second fin unit of the second heat sink.

7. The heat dissipation device as claimed in claim 6, wherein the second heat sink comprises a base and the second fin unit is thermally attached to the base.

8. The heat dissipation device as claimed in claim 1, wherein the first heat sink further comprises a frame and the spreader is thermally attached to the frame.

9. The heat dissipation device as claimed in claim 8, wherein the frame defines a cutout through a side thereof and the spreader has a sealed tube extending outwardly from a side thereof, the sealed tube being extended through the cutout of the frame when the spreader is mounted on the frame.

* * * * *